United States Patent
Azizi

[11] Patent Number: 6,130,546
[45] Date of Patent: Oct. 10, 2000

[54] AREA ARRAY (FLIP CHIP) PROBE CARD

[75] Inventor: Sayed Kamallodin Azizi, Concord, Calif.

[73] Assignee: LSI Logic Corporation, Milpitas, Calif.

[21] Appl. No.: 09/076,312

[22] Filed: May 11, 1998

[51] Int. Cl.[7] .................................................. G01R 31/02
[52] U.S. Cl. .......................... 324/761; 324/754; 324/757; 324/765; 439/482
[58] Field of Search ...................................... 324/754, 761, 324/758, 757, 762, 755, 765, 72.5; 439/482

[56] References Cited

U.S. PATENT DOCUMENTS

| | | | |
|---|---|---|---|
| 4,038,599 | 7/1977 | Bove et al. ............................... | 324/761 |
| 5,077,598 | 12/1991 | Bartelink .................................. | 357/68 |
| 5,148,103 | 9/1992 | Pasiecznik, Jr. ......................... | 324/761 |
| 5,258,648 | 11/1993 | Lin ........................................... | 257/778 |
| 5,500,605 | 3/1996 | Chang ...................................... | 324/758 |
| 5,534,784 | 7/1996 | Lum et al. ................................ | 324/757 |
| 5,606,263 | 2/1997 | Yoshizawa et al. ..................... | 324/761 |
| 5,701,085 | 12/1997 | Malladi et al. ........................... | 324/54 |

*Primary Examiner*—Josie Ballato
*Assistant Examiner*—Minh Tang

[57] ABSTRACT

A method and apparatus for testing an integrated circuit die including a probe card (10) having a plurality of surface mount pads (45) arranged in a pattern (50) substantially corresponding to an area array pattern of die bumps (25) on the IC die. The pads and the die bumps are respectively electrically connected to each other with conductive probes (30). A plurality of test contacts (55) located around the periphery of the probe card (10) are in electrical contact to each surface mount pad (45) with electrical traces (65). An integrated circuit tester (60) having a plurality of test channels is electrically connected to a selected test contact (55) of the probe card (10), thereby forming a continuous conductive path between the integrated circuit tester (60) and the die bumps (25) on the IC die.

14 Claims, 2 Drawing Sheets

AREA ARRAY (FLIP CHIP) PROBE CARD

BACKGROUND OF THE INVENTION

The present invention relates to testing of an integrated circuit die or flip-chip, and more particularly to testing the integrated circuit die using a probe card.

In the last few decades, the electronics industry has literally transformed the world. Electronic products are used by, or affect the daily lives of, a large segment of the world's population. For example, telephones, television, radios, Personal Computers (PCs), laptop PCs, palmtop PCs, PCs with built-in portable phones, cellular phones, wireless phones, pagers, modems, and video camcorders, are just a few of the electronic products that have been developed in recent years and which have been made smaller and more compact, while providing more and/or enhanced functions than ever before. The integrated circuit (IC) die or IC chip, and the more efficient packaging of the IC die, have played a key role in the success of these products.

There are three distinct stages in the manufacture of an IC die. The first stage is the material preparation. In this stage, the raw materials are mined and purified to meet semiconductor standards. The second stage consists of forming the material into wafers. The diameters of the wafers can vary between 1 and 12 inches. In the third stage, wafer fabrication, the IC dies are formed in and on the wafer. Up to several thousand can be formed on a wafer but 200 to 300 are more common.

There are several different types of packaging configurations that may be used with IC dies. Some types require wire bonding of the IC die to traces on a package substrate. Wire bonding presents several problems such as minimum height limits that are imposed by the required wire loops and a chance of electrical performance problems or shorting if the wires come too close to each other. The wire bonds require two bonds, one at each end of the wire, and must be placed one-by-one. Moreover, there are resistances associated with each bond.

One way to avoid the above problems associated with wire bonding is to eliminate the wires and use a "flip-chip". The term flip-chip derives its name from the way the IC die or chip is attached to a package substrate. Deposited metal "bumps" are formed on each bonding pad on the upper surface of the IC die. To attach the IC die to the package substrate, the IC die is "flipped" over and the "bumps" are soldered to corresponding inner leads or traces on the package substrate. Advantageously, flip-chip packages are lower profile, the electrical connections have lower resistance, and the electrical path is much shorter. One well known device manufacturer, IBM, refers to its version of this technology as "controlled collapse chip connection (C4)".

Formation of the IC dies on the wafer—the wafer fabrication process—requires a high degree of precision in process control, equipment operation, and material manufacture. One mistake can render the wafer completely useless. Throughout the process, various tests and measurements are made to determine both the wafer and process quality. Increased wafer volumes and more critical processes require more in-line testing.

After wafer fabrication is completed, the IC dies on the wafer must be electrically tested. The basic equipment required to perform electrical tests are a probe machine with the capability of positioning needle-like probes on the IC die contact pads or "bumps"; a switch box to apply a test signal, e.g., a voltage or current of a selected polarity to the "bumps"; and a method of displaying the results. In advanced systems, the probe station may be automated to sequentially test several IC dies. Typically, the IC die measurements are made by applying a voltage to the component contact probe and measuring the resultant current flowing between the "bumps". The results of such measurements are then displayed on a display screen.

The increasing complexity and circuit density of integrated circuits on semiconductor substrates requires increasingly more dense electrical connections to be made over the surface area of such substrate. Current fabrication methods allow IC dies to have over 1000 contact pads or "bumps" formed on the surface of the IC die. These bumps are physically and electrically tested at one time or another during fabrication or wafer sort. In current practice, test probes are assembled and arranged in a pattern corresponding to the physical layout of the bump area array on the surface of the IC die. The probes are then wired to a tester, usually using manually soldered jumper wires between the contact probes and conductors of the test channels of the test equipment. Disadvantageously, such probe fabrication is tedious, expensive and subject to human error. Manual soldering and the use of wire jumpers also limits the number of bumps on an IC die that can be tested because there is a minimum area between the probes and wires needed for the connections, thus limiting the number of bumps that can be tested.

One method that has been used to eliminate the wire jumpers is to insert a transition unit or "interposer" between the probe assembly and the test channels. The interposer transposes the physical array of the spatially ordered probes that are mounted to connect with bumps on the IC die into another physical array of contacts that connect with conductors of the test channels. Unfortunately, using an interposer adds another level of complexity and cost to the testing of the wafer and IC dies.

In view of the above, it is evident that what is needed is a apparatus and method of testing an integrated circuit die or flip-chip with a high number of bumps that provides contact with all the bumps, can be used with many size wafers or components, can be used on the wafer without damaging it, and eliminates the wire jumpers, thereby reducing the level of complexity of the testing process and making the testing more cost effective.

SUMMARY OF THE INVENTION

The present invention relates to testing of an integrated circuit (IC) die or flip-chip using an area array probe card. Presently, as indicated above, the test probes used in IC die testing must be manually soldered to the conductors of the test channel of the IC test unit. Manual soldering the wire jumpers not only limits the number of bumps on an IC die that can be tested (because there is a minimum area between the wires and probes needed for the connections, thus limiting the number of bumps that can be tested) but also makes the fabrication of tester channels a tedious, expensive and subject-to-human-error process.

Advantageously, the probe card of the present invention eliminates the wire jumpers and allows the testing of an IC die that has a large number of bumps, e.g., greater than 1000. The IC die design determines the layout of the die bumps, known as the area array. The probe card of the present invention has a die contact pattern array of surface mount pads arranged in a pattern that matches the die bump area array pattern on the IC die to be tested. Around the edge of the probe card are test contacts that attach to test channels of the test equipment. Each surface mount pad is attached to a particular test contact by a conductive trace.

Needle-like probes are used to connect the surface mount pads of the probe card with the bumps on the IC die. In use, the probes are assembled in a pattern matching the IC die bump array and are held in place by guide plates. The probes are placed in contact with the surface mount pads of the probe card. The wafer is then positioned over the probes and moved in toward the probe card until the probes are in contact with the die bumps, forming a continuous conductive path between the die bumps and the tester (via the probe, surface mount pad, trace and test contact). The test equipment then performs the necessary tests on the IC die.

BRIEF DESCRIPTION OF THE DRAWINGS

The above and other aspects, features and advantages of the present invention will be more apparent from the following more particular description thereof, presented in conjunction with the following drawings wherein.

DETAILED DESCRIPTION OF THE INVENTION

The following description is of the best mode presently contemplated for carrying out the invention. This description is not to be taken in a limiting sense, but is made merely for the purpose of describing the general principles of the invention. The scope of the invention should be determined with reference to the claims.

The present invention is directed to a system and method of testing integrated circuit (IC) dies in the wafer sort process, and more particularly to a probe card and a method of using the probe card in testing IC dies that have a high number of die contacts or "bumps". While this disclosure is directed to a flip-chip die, it is evident that it could also be used with many different types of IC dies.

Figure 1:
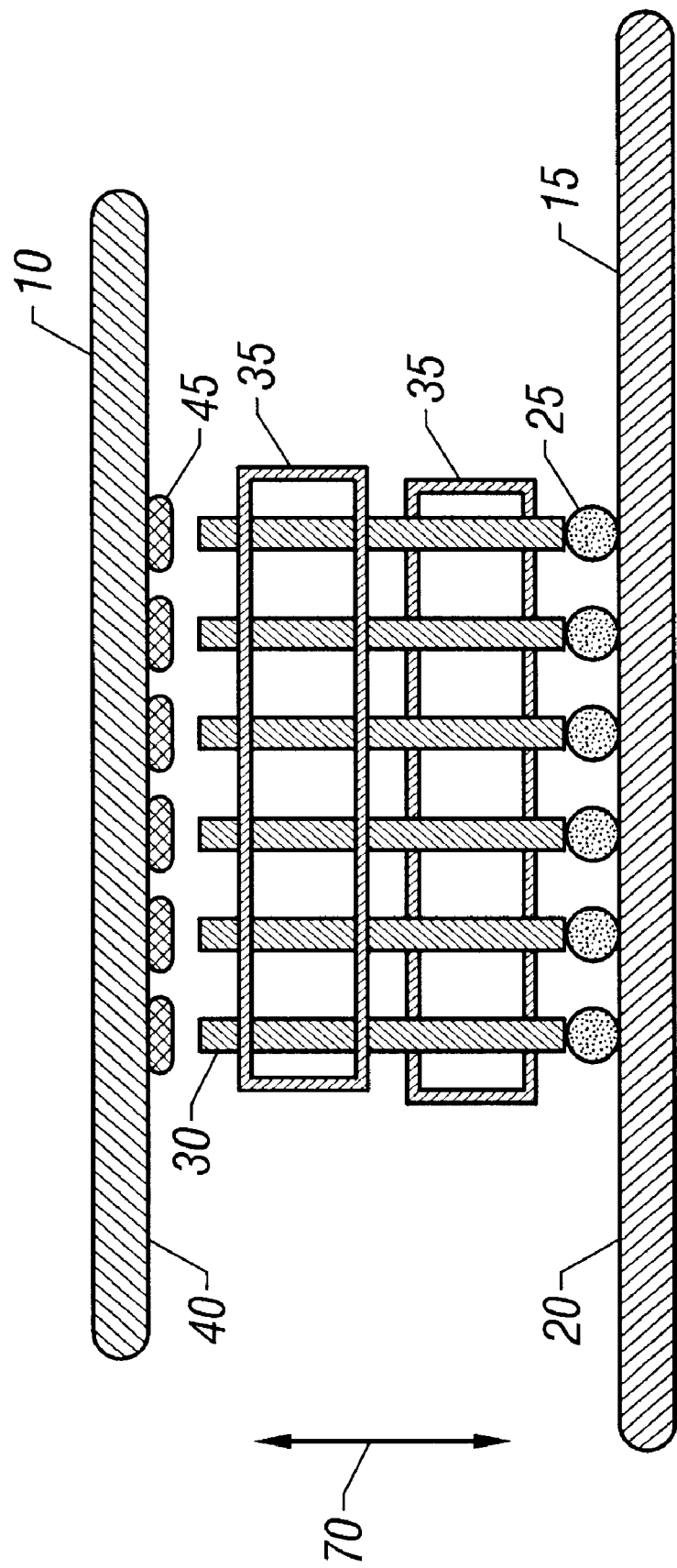
FIG. 1 is a cross-sectional view of a test setup using a probe card in accordance with the invention to test an integrated circuit die.

FIG. 1 shows a probe card 10 used in testing an integrated circuit wafer 15. Fabrication methods for wafers are known in the art. Starting with a substrate 20, integrated circuits are formed therein with associated die contacts or bumps 25. These die bumps 25 are also sometimes known as controlled collapse chip connection (C4) bumps. The die bumps 25 are positioned in a pattern on the surface of the substrate 20 known as an area array.

An assembly of needle-like probes 30 are mounted within guide plates 35 in a pattern that corresponds to the area array pattern of the die bumps 25. The needle-like probes 30 are made from electrically conductive material such as tungsten, beryllium copper or Paliney® (an alloy comprised of gold, palladium, platinum, silver, copper and zinc). The probes 30 are flexible and are collapsible, like a spring, to compensate for uneven surfaces, and other variations. The length, diameter, taper and material type of the probe 30 determines the spring rate of the probe. A typical probe diameter is 0.005 inches. The guide plates 35 are made from a electrically insulative material, such as plastic or ceramic. On the lower surface 40 of the probe card 10 are a plurality of contact pads 45. The contact pads 45 interface with the probes 30 and are arranged to match the area array pattern of the die bumps 25. The spacing of the probes 30 in the guides varies with the array pattern to be matched. A typical spacing might be 0.010 inch between probes 30.

Figure 2:
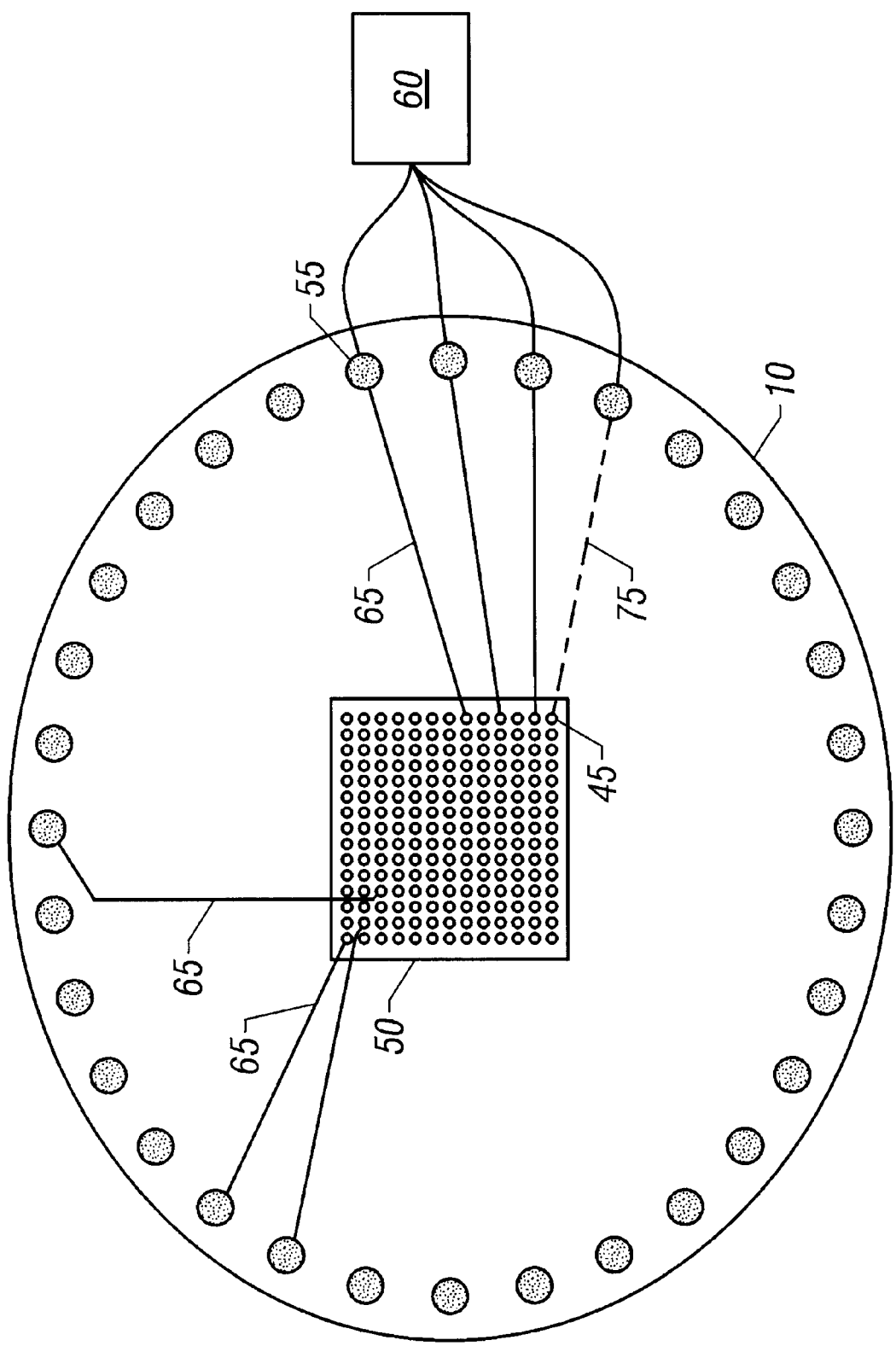
FIG. 2 is a plan view of the probe card of the invention.

FIG. 2 shows a plan view of the lower surface 40 of the probe card 10. The die contact pattern 50 is shown near the center of the probe card 10 and matches the die bump 25 area array pattern on the wafer 15. Around the edges of the probe card 10 are test contacts 55 that attach to test channels of the test equipment 60. Each contact pad 45 is attached to a particular test contact 55 by a conductive trace 65. While the conductive traces 65 are shown in FIG. 2 as being located on the lower surface 40 of the probe card 10, it is to be understood that at least some of such traces 65 may also be located on the upper surface of the probe card 10 and connected to the respective contact pads 45 and/or test contacts 55 by way of conductive vias that pass through the probe card 10. Additionally, it would be possible to make the probe card 10 as a multi-layer card, wherein some of the traces 65 are located on intermediate layers within the probe card. Optionally, each surface mount pad 45 may be connected to its respective test contact 55 with jumper wires 75 (shown in phantom in FIG. 2).

The wafer design determines the layout of the die bumps 25 on the substrate 20 of the wafer 15. Once the area array pattern of the die bumps 25 are determined, the probes 30 are positioned in the guide plates 35 to match the area array pattern of the die bumps 25. The area array pattern also determines the die contact pattern 50 on the probe card 10, so that each surface mount pad 45 has a corresponding die bump 25 on the wafer 15. Each surface mount pad 45 is in electrical contact with its corresponding die bump 25 via the probe 30. The surface mount pads 45 are electrically connected to the test equipment 60 via the traces 65 and the test contacts 55.

In use, the probes 30 are assembled in a pattern matching the area array of the die bumps 25 and are held in place by guide plates 35. The probes 30 are placed in contact with the surface mount pads 45 of the probe card 10. The test contacts 55 are then attached to their predetermined test channels of the test equipment 60.

Once configured as described above, the test unit is ready for testing the integrated circuit wafer 15. The wafer 15 may contain many area arrays of die bumps 25, and each area array may contain over 1000 die bumps 25. The die bumps 25 of the wafer 15 are positioned over the test probes 30. The wafer 15 is then moved in direction 70 toward the probe card 10 until the probes 30 are in contact with the die bumps 25. The test equipment 60 then performs the necessary tests. Once the testing is done for the particular array, the wafer 15 is moved away from the probe card 10, disengaging the probes 30 and the die bumps 25. The wafer 15 then moves to test the next area array on the substrate 20, positioning the new area array over the test probes 30, repeating the test process just described.

Advantageously, the present invention allows a wafer manufacturer to test high pin count flip-chip wafers quickly and efficiently. Probe cards of the present invention can be manufactured to match a variety of IC die arrays. These probe cards can be used in testing many size wafers, individual components or full size wafers without damaging them. The probe card eliminates the wire jumpers that limited the number of die bumps that could previously be tested and makes the testing of wafers more cost effective.

While the invention herein disclosed has been described by means of specific embodiments and applications thereof, numerous modifications and variations could be made thereto by those skilled in the art without departing from the scope of the invention set forth in the claims.

What is claimed is:

1. Apparatus for testing an integrated circuit (IC) die having a pattern of die bumps located thereon comprising:

a probe card having a probe card surface;

a plurality of surface mount pads on the probe card surface arranged in a pattern substantially corresponding to the pattern of die bumps on the IC die;

a plurality of electrical probes each having a top end and a bottom end;

said plurality of electrical probes arranged in a pattern substantially corresponding to the pattern of the die bumps to be tested, each probe corresponding to a selected die bump;

said plurality of electrical probes further arranged such that in use said top end is in mechanical and electrical contact with said surface mount pads on the probe card and said bottom end is in electrical contact with said die bumps on the IC die;

a means for holding the probes together in the pattern;

a plurality of test contacts located around the periphery of the probe card surface;

means for electrically connecting each surface mount pad with a corresponding test contact; and an integrated circuit tester having a plurality of test channels, each test channel being electrically connected to a selected test contact of the probe card, thereby forming a continuous conductive path between the integrated circuit tester and the die bumps on the IC die.

2. The apparatus of claim 1 wherein the means for holding the plurality of probes comprises at least one guide plate.

3. The apparatus of claim 1 wherein each probe is individually collapsible in an axial direction.

4. The apparatus of claim 1 wherein the integrated circuit die bumps comprise controlled collapse chip connection (C4) bumps on a flip-chip integrated circuit die.

5. The apparatus of claim 4 wherein the integrated circuit die C4 bumps are arranged in an area array pattern.

6. The apparatus of claim 1 wherein the means for electrically connecting each surface mount pad with a corresponding test contact comprises a plurality of traces located on the probe card surface.

7. The apparatus of claim 1 wherein the means for electrically connecting each surface mount pad with a corresponding test contact comprises a plurality of jumper wires.

8. The apparatus of claim 1 wherein the number of die bumps is greater than 1000.

9. Apparatus for testing an integrated circuit die having a pattern of die bumps located thereon comprising:

a probe card having a plurality of surface mount pads arranged in a pattern substantially corresponding to the pattern of die bumps on the IC die, a plurality of test contacts located around the periphery of the probe card, and means for electrically connecting each surface mount pad with a corresponding test contact;

an integrated circuit tester having a plurality of test channels, each test channel being electrically connected to a selected test contact of the probe card;

a plurality of collapsible electrical probes arranged in a pattern substantially corresponding to the pattern of the die bumps, said collapsible probes being held compressibly between said plurality of surface mount pads and said corresponding pattern of die bumps, wherein a continuous conductive path between the integrated circuit tester and the die bumps is formed.

10. An apparatus for testing an integrated circuit die as in claim 9, wherein said plurality of collapsible electrical probes arranged in a pattern substantially corresponding to the pattern of the die bumps is maintained in said pattern by at least one non-conducting guide plate.

11. A method for testing an integrated circuit wafer having multiple integrated circuit (IC) dies formed therein, the IC dies having a pattern of die bumps located thereon, comprising the steps of:

(a) providing a probe card having a plurality of surface mount pads arranged in a pattern substantially corresponding to the pattern of die bumps on the IC die and a plurality of test contacts located around the periphery of the probe card;

(b) providing a plurality of electrical probes arranged in a pattern substantially corresponding to the pattern of the die bumps to be tested, each probe corresponding to a selected die bump and each probe having a top end and a bottom end;

(c) positioning the wafer near the probe card;

(d) engaging a plurality of probes with a first IC die on the wafer, the probes electrically and mechanically connecting to the surface mount pads and electrically connecting to selected ones of the die bumps, thereby forming a continuous conductive path between the test contacts and the die bumps;

(e) connecting at least one test channel of an integrated circuit tester having a plurality of test channels to a selected test contact of the probe card; and (f) testing the integrated circuit die with the integrated circuit tester.

12. The method of claim 11 wherein the integrated circuit die bumps comprise controlled collapse chip connection (C4) bumps on a flip-chip integrated circuit die.

13. The method of claim 11 wherein the integrated circuit die C4 bumps are arranged in an area array pattern.

14. The method of claim 11 further comprising the steps of:

(g) disengaging the first IC die from the plurality of probes;

(h) re-positioning the wafer near the probe card;

(i) re-engaging the plurality of probes with a second IC die for testing; and (j) testing the second IC die with the integrated circuit tester.

* * * * *